(12) United States Patent
Lin et al.

(10) Patent No.: US 9,748,144 B1
(45) Date of Patent: Aug. 29, 2017

(54) METHOD OF FABRICATING SEMICONDUCTOR DEVICE

(71) Applicant: UNITED MICROELECTRONICS CORP., Hsin-Chu (TW)

(72) Inventors: Ching-Ling Lin, Kaoshiung (TW);
Yi-Wen Chen, Tainan (TW);
Chen-Ming Huang, Taipei (TW);
Ren-Peng Huang, Tainan (TW);
Ching-Fu Lin, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/138,228

(22) Filed: Apr. 26, 2016

(51) Int. Cl.
| | | |
|---|---|---|
| H01L 21/00 | (2006.01) | |
| H01L 21/8234 | (2006.01) | |
| H01L 29/66 | (2006.01) | |
| H01L 21/3105 | (2006.01) | |
| H01L 21/3213 | (2006.01) | |
| H01L 29/423 | (2006.01) | |
| H01L 21/321 | (2006.01) | |
| H01L 21/033 | (2006.01) | |
| H01L 29/51 | (2006.01) | |
| H01L 21/28 | (2006.01) | |
| H01L 27/11 | (2006.01) | |

(52) U.S. Cl.
CPC .. *H01L 21/823456* (2013.01); *H01L 21/0332* (2013.01); *H01L 21/28079* (2013.01); *H01L 21/28088* (2013.01); *H01L 21/31055* (2013.01); *H01L 21/32115* (2013.01); *H01L 21/32139* (2013.01); *H01L 21/823431* (2013.01); *H01L 29/42376* (2013.01); *H01L 29/517* (2013.01); *H01L 29/518* (2013.01); *H01L 29/66545* (2013.01); *H01L 27/1104* (2013.01); *H01L 27/1116* (2013.01)

(58) Field of Classification Search
None
See application file for complete search history.

(56) References Cited

U.S. PATENT DOCUMENTS

| | | | |
|---|---|---|---|
| 8,673,755 B2 | 3/2014 | Chang | |
| 9,484,263 B1 * | 11/2016 | Lin | H01L 21/823437 |
| 2011/0312180 A1 * | 12/2011 | Wang | H01L 21/31055 |
| | | | 438/692 |
| 2013/0164930 A1 * | 6/2013 | Tu | H01L 21/31053 |
| | | | 438/595 |
| 2015/0187903 A1 * | 7/2015 | Niimi | H01L 29/517 |
| | | | 257/401 |

(Continued)

*Primary Examiner* — Evren Seven
(74) *Attorney, Agent, or Firm* — Winston Hsu

(57) ABSTRACT

First and second semiconductor structures, a CESL, and an ILD layer are formed on a substrate. The first semiconductor structure includes first dummy gate, first nitride mask, and first oxide mask. The second semiconductor structure includes second dummy gate, second nitride mask, and second oxide mask. A first planarization is performed to remove a portion of the ILD layer, exposing CESL. A portion of the CESL, a portion of the ILD layer, the first and the second oxide masks are removed. A hard mask layer is formed on the first and the second nitride masks, and in a recess of the ILD layer. A second planarization is performed to remove a portion of the hard mask layer, the first and the second nitride masks, exposing first and second dummy gates. A remaining portion of the hard mask layer covers the ILD layer.

14 Claims, 8 Drawing Sheets

(56) References Cited

U.S. PATENT DOCUMENTS

2015/0255293 A1* 9/2015 Zhu .................. H01L 21/76819
438/587
2015/0333063 A1* 11/2015 Shao ................. H01L 21/31053
257/369

* cited by examiner

METHOD OF FABRICATING SEMICONDUCTOR DEVICE

BACKGROUND OF THE INVENTION

1. Field of the Invention

The present invention relates generally to a method of fabricating semiconductor devices. More particularly, the present invention relates to a method of fabricating a fin field-effect-transistor (Fin-FET) device with better gate height control and ILD (inter-layer dielectric) control.

2. Description of the Prior Art

Continuing advances in semiconductor manufacturing processes have resulted in semiconductor devices with finer features and higher degrees of integration. As the size of the integrated circuit (IC) devices continues to scale down, the polysilicon gate and the silicon dioxide insulating layer of a metal-oxide-semiconductor field effect transistor (MOSFET) structure have confronted with the physical limits of the materials themselves. To meet the demands of scalability, it is necessary to incorporate high-k metal gate (HK/MG) process.

Typically, two main integration options are used: gate-first (often referred to as MIPS, metal inserted poly-silicon) and gate-last (also called RMG, replacement metal gate). The terminology "first" and "last" refers to whether the metal electrode is deposited before or after the high temperature activation anneal of the flow. The RMG process typically involves a bulk tungsten filling process in a gate trench to form a low-resistance metal layer in the composite metal gate structure.

The scaling down of the feature sizes has also increased the complexity of processing and manufacturing ICs. For example, the prior art method for forming a three dimensional transistor such as a fin field-effect transistor (FinFET) usually requires the deposition of Flowable CVD oxide and HDPCVD oxide, followed by at least three CMP steps: FOXCMP (FCVD oxide CMP), HDPCMP (HDPCVD oxide CMP), and POPCMP (Poly Opening Polish CMP), which lead to worse dishing effect and gate height control issue. Therefore, there is a need in this technical field to provide an improved method of fabricating a semiconductor structure such as a FinFET device without such issues.

SUMMARY OF THE INVENTION

It is one object of the invention to provide an improved method for manufacturing a fin field-effect-transistor (FinFET) device with better gate height control and ILD (inter-layer dielectric) control.

According to one aspect of the present invention, a method of fabricating a semiconductor device is disclosed. A substrate is provided. A first semiconductor structure and a second semiconductor structure are formed on the substrate. A contact etch stop layer (CESL) covers the first semiconductor structure and the second semiconductor structure. An inter-layer dielectric (ILD) layer covers the CESL.

The first semiconductor structure comprises a first dummy gate, a first nitride mask on the first dummy gate, and a first oxide mask on the first nitride mask. The second semiconductor structure comprises a second dummy gate, a second nitride mask on the second dummy gate, and a second oxide mask on the second nitride mask.

A first planarization process is performed to remove a portion of the ILD layer, thereby exposing a top surface of the CESL.

Subsequently, a portion of the CESL, a portion of the ILD layer, the first oxide mask, and the second oxide mask are removed to expose the first nitride mask and the second nitride mask. A portion of the ILD layer is removed to form a recess in the ILD layer between the first semiconductor structure and the second semiconductor structure. A hard mask layer is then formed on the first nitride mask and the second nitride mask, and on the ILD layer. The hard mask layer fills up the recess.

A second planarization process is then performed to remove a portion of the hard mask layer, the first nitride mask, and the second nitride mask, thereby exposing a top surface of the first dummy gate and a top surface of the second dummy gate. A remaining portion of the hard mask layer covers a top surface of the ILD layer between the first semiconductor structure and the second semiconductor structure.

Subsequently, the first dummy gate and the second dummy gate are removed to form a first gate trench and a second gate trench. A first metal gate is formed in the first gate trench and a second metal gate is formed in the second gate trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
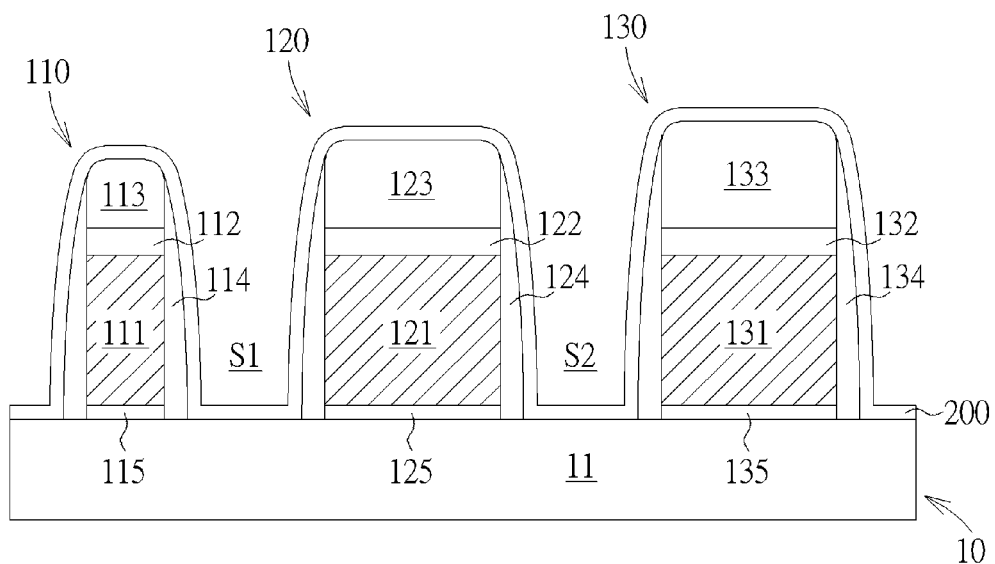
FIGS. 1-9 are schematic diagrams illustrating an exemplary method of fabricating a fin field-effect-transistor (Fin-FET) device in accordance with one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

The terms substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used herein is defined as a plane parallel to the conventional major plane or surface of a semiconductor substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Please refer to FIGS. 1-9, which are schematic diagrams illustrating an exemplary method of fabricating a fin field-effect-transistor (Fin-FET) device in accordance with one embodiment of the invention.

First, as shown in FIG. 1, a semiconductor substrate 10 is provided. For example, the semiconductor substrate 10 may comprise a silicon substrate, a SiGe substrate, or a silicon-on-insulator (SOI) substrate, but is not limited thereto. The semiconductor substrate 10 comprises at least one fin structure 11. A first semiconductor structure 110 and a second semiconductor structure 120 are formed on the fin structure 11. The first semiconductor structure 110 may be in close proximity to the second semiconductor structure 120 with a spacing S1 therebetween.

Optionally, a third semiconductor structure 130 may be formed on the fin structure 11. The third semiconductor structure 130 may be disposed in close proximity to the second semiconductor structure 120 with a spacing S2 therebetween.

According to one embodiment, for example, the first semiconductor structure 110 may comprise a dummy gate 111, a silicon nitride hard mask 112, an oxide hard mask 113, sidewall spacers 114, and an interfacial layer 115 between the dummy gate 111 and the fin structure 11. The second semiconductor structure 120 may comprise a dummy gate 121, a silicon nitride hard mask 122, an oxide hard mask 123, sidewall spacers 124, and an interfacial layer 125 between the dummy gate 121 and the fin structure 11. The third semiconductor structure 130 may comprise a dummy gate 131, a silicon nitride hard mask 132, an oxide hard mask 133, sidewall spacers 134, and an interfacial layer 135 between the dummy gate 131 and the fin structure 11. The dummy gates 111, 121, and 131 may comprise amorphous silicon or polysilicon, but is not limited thereto.

According to the embodiment, for example, the first semiconductor structure 110 may be a core FinFET device such as a gate of a Static RAM (SRAM) transistor device having a gate length that is less than or equal to 20 nm. According to one embodiment, for example, the second semiconductor structure 120 may be a peripheral FinFET device such as a transistor of an input/output (I/O) circuit generally having a gate length that is greater than 20 nm. According to the embodiment, for example, the third semiconductor structure 130 may be a bump structure formed at the interface between an N type device and a P type device.

According to the embodiment, initially, the first semiconductor structure 110, the second semiconductor structure 120, and the third semiconductor structure 130 may have different heights. For example, the height of the third semiconductor structure 130 may be slightly greater than that of the second semiconductor structure 120, and the height of the second semiconductor structure 120 may be slightly greater than that of the first semiconductor structure 110.

Subsequently, a contact etch stop layer (CESL) 200 is deposited on the semiconductor substrate 10 in a blanket manner. The CESL 200 conformally covers the first semiconductor structure 110, the second semiconductor structure 120, and the third semiconductor structure 130.

Although not shown in the figures, it is understood that source or drain doping regions including, but not limited to, lightly doped drain (LDD) regions may be formed in the fin structure 11 prior to the deposition of the CESL 200. In addition, after the formation of the first semiconductor structure 110, the second semiconductor structure 120, and the third semiconductor structure 130, dual epitaxial growth process may be performed to form epitaxial layers in the fin structure 11. For example, the dual epitaxial growth process may comprise SiP epitaxial growth process and SiGe epitaxial growth process, but is not limited thereto.

Figure 2:
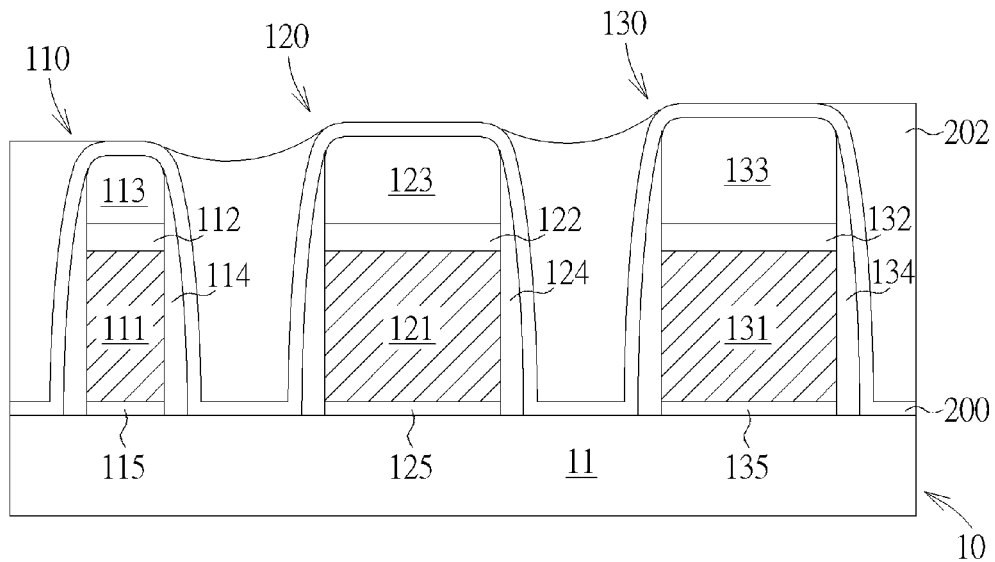

As shown in FIG. 2, an inter-layer dielectric (ILD) layer 202 is then deposited on the CESL 200 in a blanket manner. The ILD layer 202 covers the CESL 200. The ILD layer 202 completely fills up the spacing S1 between the first semiconductor structure 110 and the second semiconductor structure 120, and the spacing S2 between the second semiconductor structure 120 and the third semiconductor structure 130. According to the embodiment, the ILD layer 202 may be a Flowable CVD (FCVD) oxide layer that is deposited by a Flowable CVD process.

The semiconductor substrate 10 is then subjected to a first chemical mechanical polishing (CMP) process is remove the excess ILD layer 202 directly above first semiconductor structure 110, the second semiconductor structure 120, and the third semiconductor structure 130, thereby exposing the CESL 200 directly above first semiconductor structure 110, directly above the second semiconductor structure 120, and directly above the third semiconductor structure 130. At this point, the spacing S1 between the first semiconductor structure 110 and the second semiconductor structure 120 and the spacing S2 between the second semiconductor structure 120 and the third semiconductor structure 130 are still filled up with the ILD layer 202.

Figure 3:
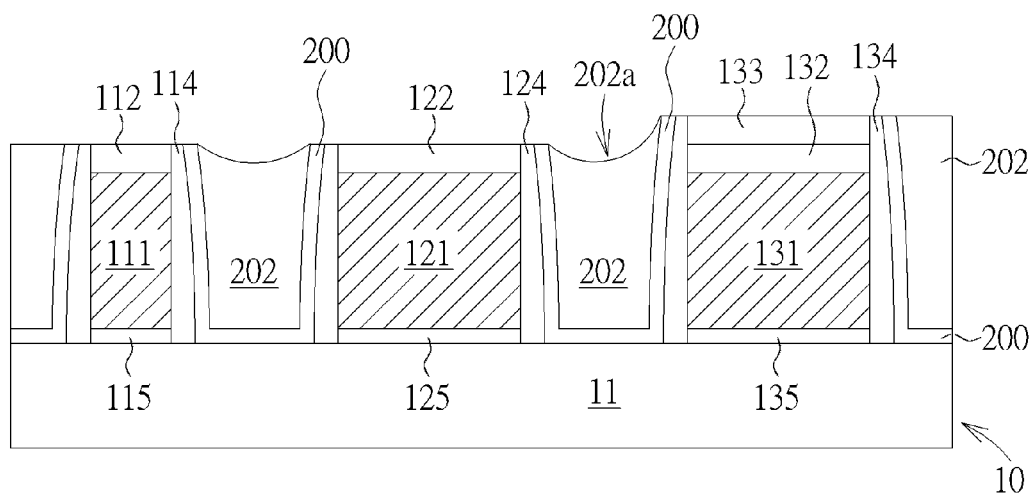

As shown in FIG. 3, an etching process or a polishing process is then carried out to etch away the exposed CESL 200, the oxide hard mask 113 of the first semiconductor structure 110, the oxide hard mask 123 of the second semiconductor structure 120, a portion of the oxide hard mask 133 of the third semiconductor structure 130, and an upper portion of the ILD layer 202. According to the embodiment, the upper portions of the sidewall spacers 114, 124, and 134 may also be removed at this stage.

At this point, the silicon nitride hard masks 112 and 122 are exposed, while the silicon nitride hard mask 132 is still covered by the remaining oxide hard mask 133. According to the embodiment, a slight recess 202a may be formed either between the first semiconductor structure 110 and the second semiconductor structure 120 or between the second semiconductor structure 120 and the third semiconductor structure 130.

Figure 4:
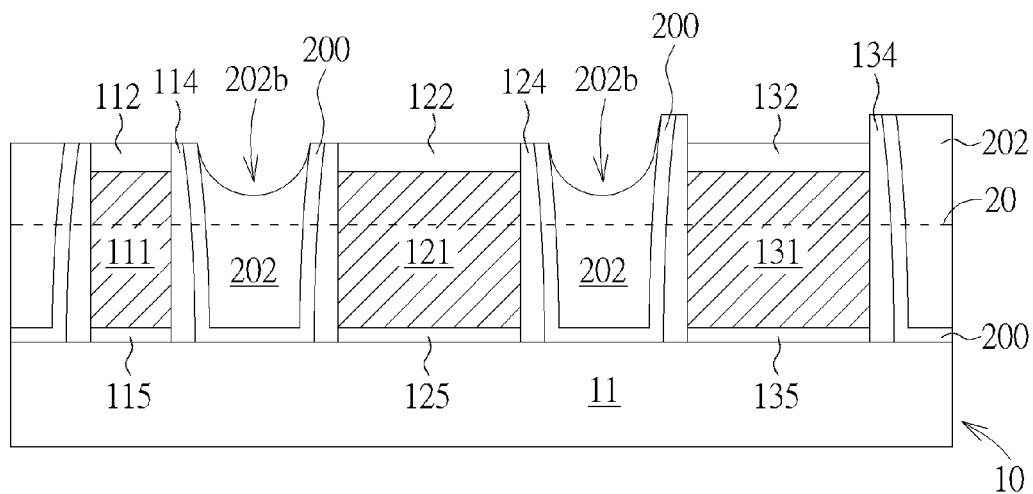

As shown in FIG. 4, an oxide removal process is then performed to remove the remaining oxide hard mask 133 from the top surface of the silicon nitride hard mask 132. The oxide removal process may be a wet etching process or a dry etching process. When removing the remaining oxide hard mask 133, the top surface of the ILD layer 302 is also etched, thereby forming a recess 202b in the ILD layer 202 either between the first semiconductor structure 110 and the second semiconductor structure 120 or between the second semiconductor structure 120 and the third semiconductor structure 130. A dashed line 20 is shown in this figure. The dashed line 20 is a control line that indicates the final gate height (or target gate height) for the meal gates of the first, second, and third semiconductor structures 110, 120, and 130.

Figure 5:
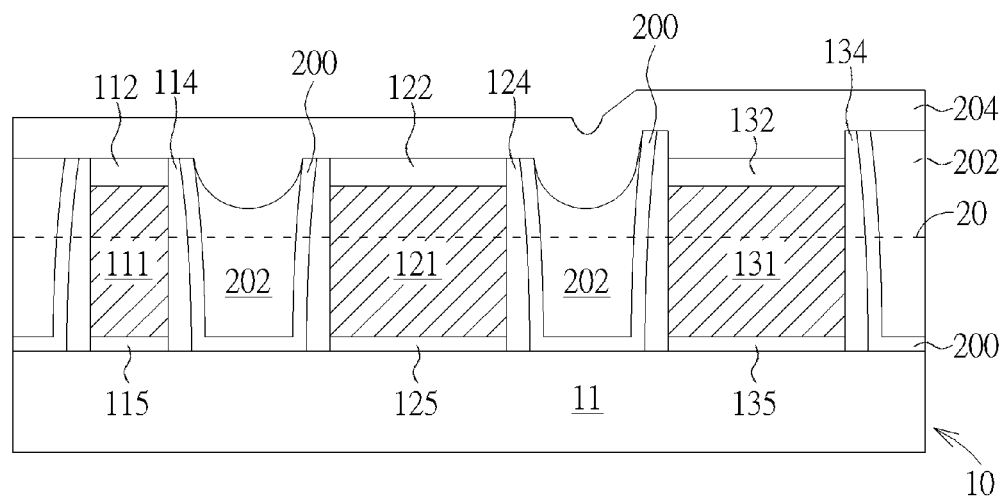

Subsequently, as shown in FIG. 5, a hard mask layer 204 such as a silicon nitride hard mask layer is deposited on the semiconductor substrate 10 in a blanket manner. The hard mask layer 204 is in direct contact with the silicon nitride hard masks 112, 122, 132, and the ILD layer 202. At this point, the recesses 202b are filled up with the hard mask layer 204.

Figure 6:
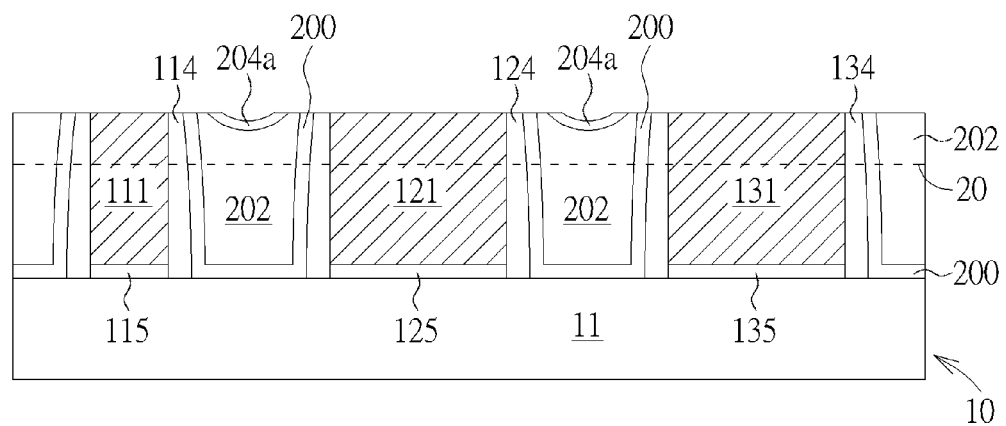

As shown in FIG. 6, a second CMP process is performed to remove an upper portion of the hard mask layer 204, the silicon nitride hard mask 112, the silicon nitride hard mask 122, and the silicon nitride hard mask 132, thereby exposing the top surface of the dummy gate 111, the top surface of the dummy gate 121, and the top surface of the dummy gate 131. According to the embodiment, after the second CMP process, the remaining portion 204a of the hard mask layer 204 partially covers the top surface of the ILD layer 202 either between the first semiconductor structure 110 and the second semiconductor structure 120 or between the second semiconductor structure 120 and the third semiconductor structure 130.

Figure 7:
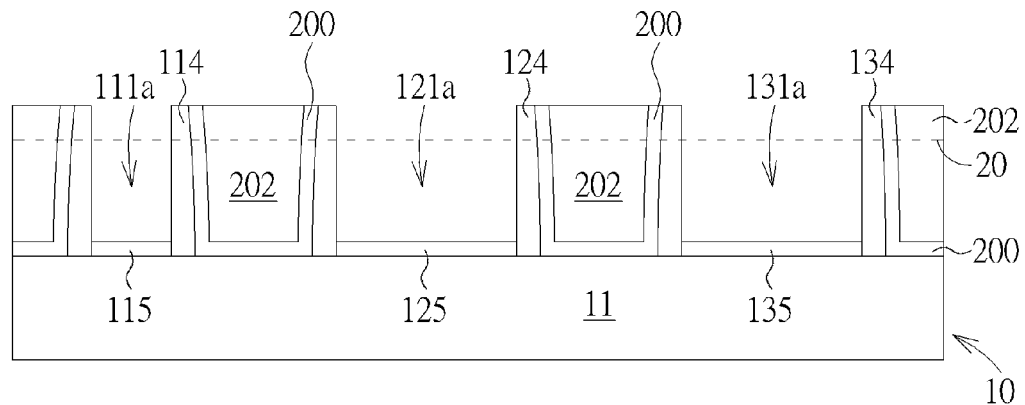

As shown in FIG. 7, after performing the second CMP process, the dummy gate 111, the dummy gate 121, and the dummy gate 131 are selectively removed, thereby forming gate trench 111a, gate trench 121a, and gate trench 131a, respectively. According to the embodiment, during the removal process of the dummy gate 111, the dummy gate 121, and the dummy gate 131, the residual hard mask layer 204 is also removed from the top surface of the ILD layer 202.

Figure 8:
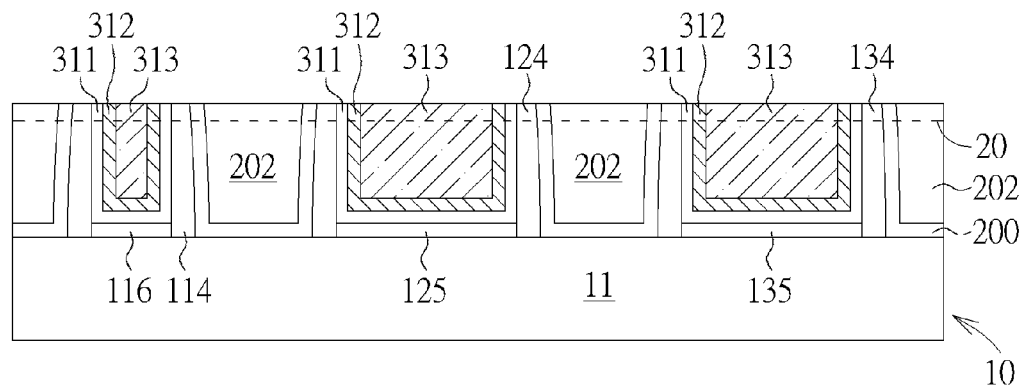
Figure 9:
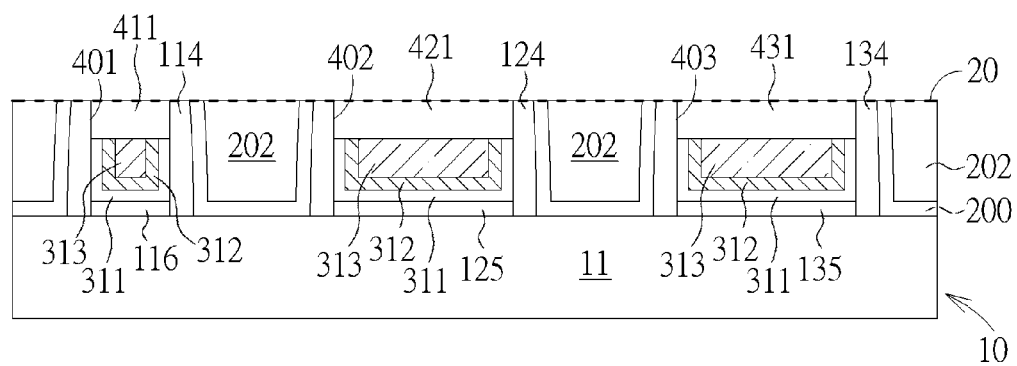

FIG. 8 and FIG. 9 illustrate an exemplary high-k/metal gate (HK/MG) process after the formation of the gate trench 111a, gate trench 121a, and gate trench 131a. As shown in FIG. 8, for example, the interfacial layer 115 may be removed from the gate trench 111a to expose the fin structure 11 within the gate trench 111a. A chemical oxide layer 116 is then formed on the fin structure 11 within the gate trench 111a.

Subsequently, a high-k dielectric layer 311, a work function metal layer 312, and a tungsten layer 313 are deposited on the semiconductor substrate 10 and into the gate trench 111a, gate trench 121a, and gate trench 131a. The excess high-k dielectric layer 311, work function metal layer 312, and tungsten layer 313 outside the gate trench 111a, gate trench 121a, and gate trench 131a are removed by using a third CMP process such as tungsten CMP (WCMP) process, thereby exposing the flat top surface of the ILD layer 202.

According to one embodiment, for example, the high-k dielectric layer 311 may comprise hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), or barium strontium titanate ($Ba_xSr_{1-x}TiO_3$, BST).

According to one embodiment, for example, the work function metal layer 312 may comprise at least a metal film including, but not limited to, tantalum nitride (TaN) or titanium nitride (TiN), titanium carbide (TiC), tantalum carbide (TaC), tungsten carbide (WC), titanium aluminide (TiAl), aluminum titanium nitride (TiAlN), aluminum, tungsten, titanium aluminum alloy (TiAl), or cobalt tungsten phosphide (CoWP).

As shown in FIG. 9, a tungsten etch back process is perform to remove at least an upper portion of the tungsten layer 313 and an upper portion of the work function metal layer 312, thereby forming recesses 401, 402, and 403 in place. Subsequently, cap layers 411, 421, and 431 such as silicon nitride cap layers are formed into the recesses 401, 402, and 403, respectively. To form the cap layers 411, 421, and 431, for example, a silicon nitride layer is deposited on the semiconductor substrate 10 in a blanket manner. A fourth CMP process is then performed to remove excess silicon nitride layer outside the recesses 401, 402, and 403. During the fourth CMP process, an upper portion of the ILD layer 202 may also be removed thereby achieving the final gate height (or target gate height) for the meal gates of the first, second, and third semiconductor structures 110, 120, and 130.

Figure 10:
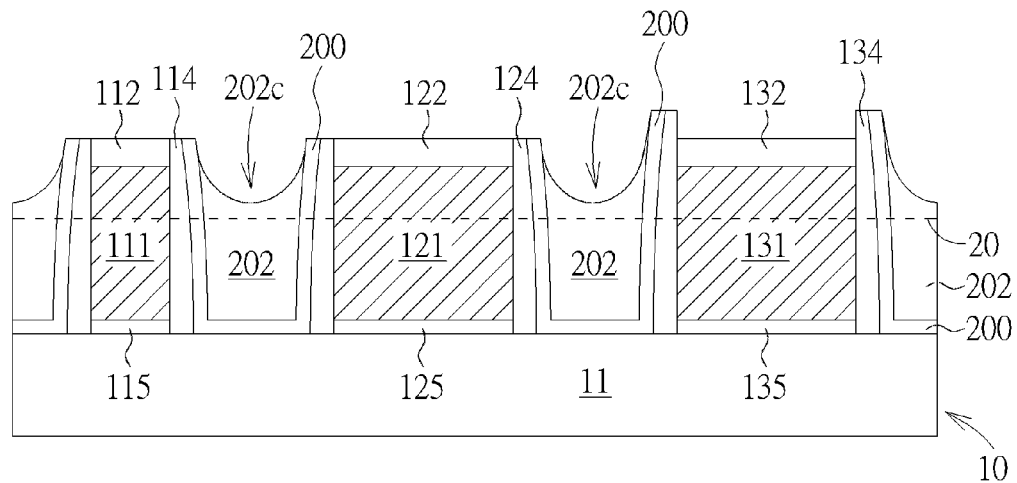
FIGS. 10-15 are schematic diagrams illustrating an exemplary method of fabricating a Fin-FET device in accordance with another embodiment of the invention.

FIGS. 10-15 are schematic diagrams illustrating an exemplary method of fabricating a Fin-FET device in accordance with another embodiment of the invention. As shown in FIG. 10, after the etching process as described in FIG. 3, likewise, an oxide removal process is then performed to remove the remaining oxide hard mask 133 from the top surface of the silicon nitride hard mask 132. The oxide removal process may be a wet etching process or a dry etching process. When removing the remaining oxide hard mask 133, the top surface of the ILD layer 302 is also etched, thereby forming a deeper recess 202c in the ILD layer 202 either between the first semiconductor structure 110 and the second semiconductor structure 120 or between the second semiconductor structure 120 and the third semiconductor structure 130.

Figure 11:
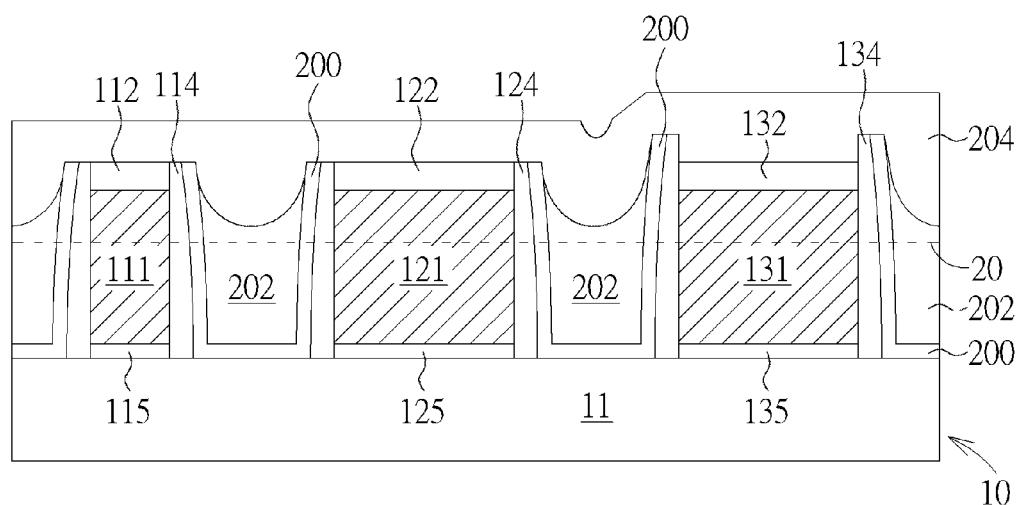

As shown in FIG. 11, a hard mask layer 204 such as a silicon nitride hard mask layer is deposited on the semiconductor substrate 10 in a blanket manner. The hard mask layer 204 is in direct contact with the silicon nitride hard masks 112, 122, 132, and the ILD layer 202. At this point, the recesses 202c are filled up with the hard mask layer 204.

Figure 12:
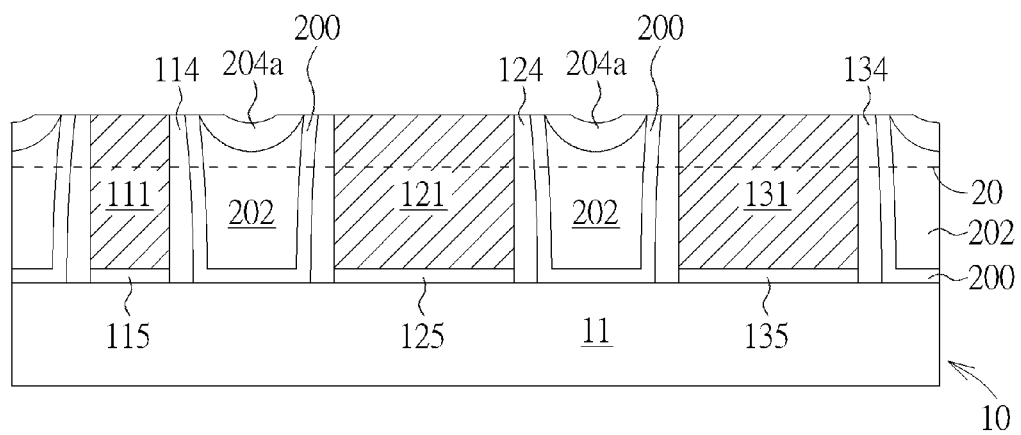

As shown in FIG. 12, a second CMP process is performed to remove an upper portion of the hard mask layer 204, the silicon nitride hard mask 112, the silicon nitride hard mask 122, and the silicon nitride hard mask 132, thereby exposing the top surface of the dummy gate 111, the top surface of the dummy gate 121, and the top surface of the dummy gate 131. According to the embodiment, after the second CMP process, the remaining portion 204a of the hard mask layer 204 completely covers the top surface of the ILD layer 202 either between the first semiconductor structure 110 and the second semiconductor structure 120 or between the second semiconductor structure 120 and the third semiconductor structure 130.

Figure 13:
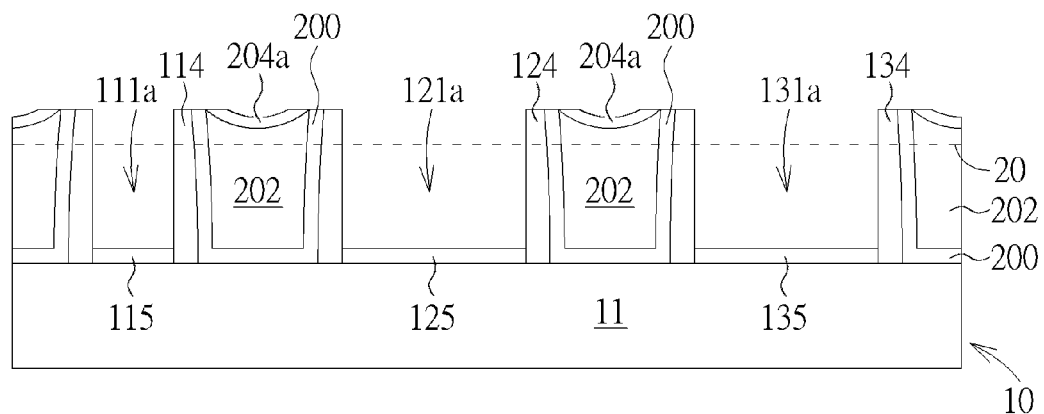

As shown in FIG. 13, after performing the second CMP process, the dummy gate 111, the dummy gate 121, and the dummy gate 131 are selectively removed, thereby forming gate trench 111a, gate trench 121a, and gate trench 131a, respectively. According to the embodiment, during the removal process of the dummy gate 111, the dummy gate 121, and the dummy gate 131, the residual hard mask layer 204a still covers the top surface of the ILD layer 202.

Figure 14:
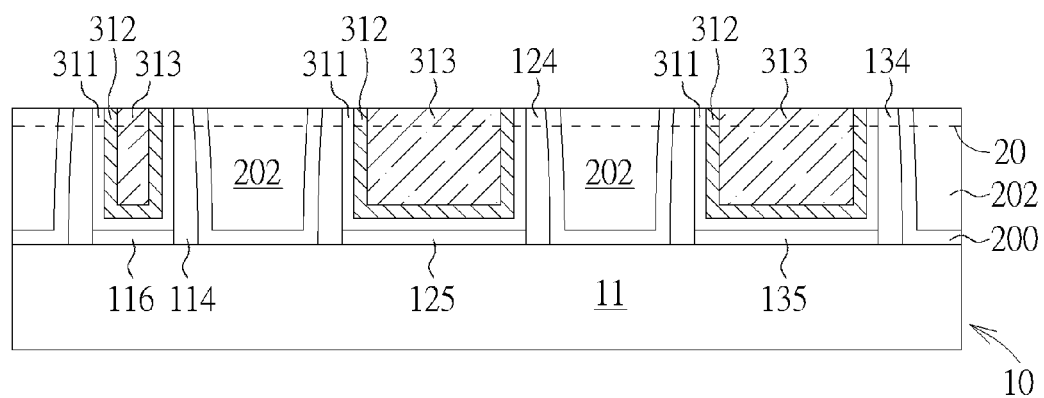

As shown in FIG. 14, for example, the interfacial layer 115 may be removed from the gate trench 111a to expose the fin structure 11 within the gate trench 111a. A chemical oxide layer 116 is then formed on the fin structure 11 within the gate trench 111a. Subsequently, a high-k dielectric layer 311, a work function metal layer 312, and a tungsten layer 313 are deposited on the semiconductor substrate 10 and into the gate trench 111a, gate trench 121a, and gate trench 131a. The excess high-k dielectric layer 311, work function metal layer 312, and tungsten layer 313 outside the gate trench 111a, gate trench 121a, and gate trench 131a are removed by using a third CMP process such as tungsten CMP process, thereby exposing the flat top surface of the ILD layer 202.

Figure 15:
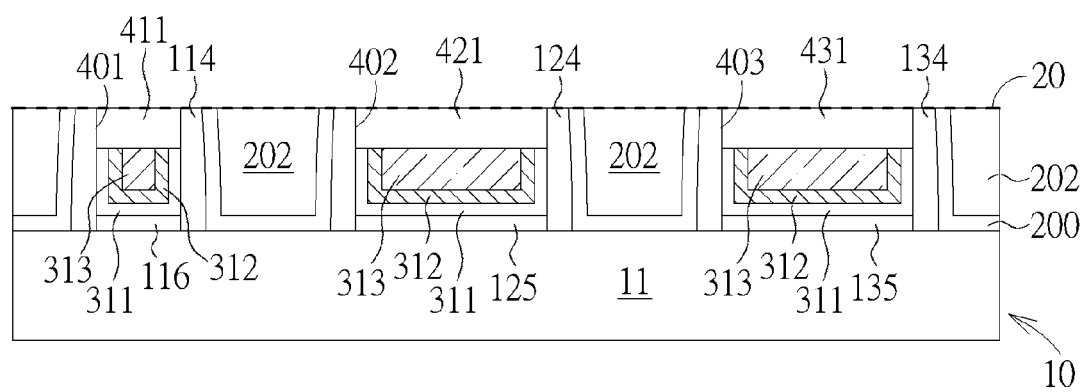

As shown in FIG. 15, a tungsten etch back process is perform to remove at least an upper portion of the tungsten layer 313 and an upper portion of the work function metal layer 312, thereby forming recesses 401, 402, and 403 in place. Subsequently, cap layers 411, 421, and 431 such as silicon nitride cap layers are formed into the recesses 401, 402, and 403, respectively. To form the cap layers 411, 421, and 431, for example, a silicon nitride layer is deposited on the semiconductor substrate 10 in a blanket manner. A fourth CMP process is then performed to remove excess silicon nitride layer outside the recesses 401, 402, and 403. During the fourth CMP process, an upper portion of the ILD layer 202 may also be removed thereby achieving the final gate height (or target gate height) for the meal gates of the first, second, and third semiconductor structures 110, 120, and 130.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
providing a substrate having a first semiconductor structure, a second semiconductor structure, a contact etch stop layer (CESL) covering the first semiconductor structure and the second semiconductor structure, an inter-layer dielectric (ILD) layer covering the CESL, wherein the first semiconductor structure comprises a first dummy gate, a first nitride mask on the first dummy gate, and a first oxide mask on the first nitride mask, wherein the second semiconductor structure comprises a second dummy gate, a second nitride mask on the second dummy gate, and a second oxide mask on the second nitride mask;
performing a first planarization process to remove a first portion of the ILD layer, thereby exposing a top surface of the CESL;
then removing a portion of the CESL, a second portion of the ILD layer, the first oxide mask, and the second oxide mask to expose the first nitride mask and the second nitride mask;
then removing a third portion of the ILD layer to form a recess in the remaining ILD layer between the first semiconductor structure and the second semiconductor structure;
then forming a hard mask layer on the remaining first nitride mask, the remaining second nitride mask and the remaining ILD layer, wherein the hard mask layer fills up the recess;
then performing a second planarization process to remove a portion of the hard mask layer, the remaining first nitride mask and the remaining second nitride mask, thereby exposing a top surface of the first dummy gate and a top surface of the second dummy gate, wherein a remaining portion of the hard mask layer covers a top surface of the remaining ILD layer between the first semiconductor structure and the second semiconductor structure;
then removing the first dummy gate and the second dummy gate to form a first gate trench and a second gate trench; and
then forming a first metal gate in the first gate trench and a second metal gate in the second gate trench.

2. The method according to claim 1, wherein the ILD layer is a Flowable CVD (FCVD) oxide layer.

3. The method according to claim 1, wherein the first dummy gate and the second dummy gate comprise amorphous silicon or polysilicon.

4. The method according to claim 1, wherein the remaining portion of the hard mask layer completely covers the top surface of the remaining ILD layer between the first semiconductor structure and the second semiconductor structure.

5. The method according to claim 4, wherein the remaining portion of the hard mask layer is in direct contact with the CESL.

6. The method according to claim 1, wherein the remaining portion of the hard mask layer partially covers the top surface of the remaining ILD layer between the first semiconductor structure and the second semiconductor structure.

7. The method according to claim 6, wherein the remaining portion of the hard mask layer is not in physical contact with the CESL.

8. The method according to claim 1, wherein the first metal gate and the second metal gate have different gate lengths.

9. The method according to claim 8, wherein the first semiconductor structure is a core FinFET having a gate length less than or equal to 20 nm, and the second semiconductor structure is a peripheral FinFET having a gate length greater than 20 nm.

10. The method according to claim 1, wherein the hard mask layer comprises silicon nitride.

11. The method according to claim 1, wherein the ILD layer and the CESL completely fill up a space between the first semiconductor structure and the second semiconductor structure.

12. The method according to claim 1, wherein the first semiconductor structure further comprises a first spacer on a sidewall of the first dummy gate and the second semiconductor structure further comprises a second spacer on a sidewall of the second dummy gate.

13. The method according to claim 1, wherein the first semiconductor structure further comprises a first interfacial layer between the first dummy gate and the substrate, and the second semiconductor structure further comprises a second interfacial layer between the second dummy gate and the substrate.

14. The method according to claim 13, wherein forming the first metal gate in the first gate trench and the second metal gate in the second gate trench comprises:
removing the first interfacial layer and the second interfacial layer to expose the substrate from the first gate trench and the second gate trench respectively;
forming a chemical oxide layer on the substrate exposed from the first gate trench and the second gate trench;
forming a high-k dielectric layer in the first gate trench and in the second gate trench;
forming a work function metal layer on the high-k dielectric layer;
forming a tungsten layer on the work function metal layer; and performing a third planarization process to remove a portion of the tungsten layer, a portion of the work function metal layer and a portion of the high-k dielectric layer.

* * * * *